United States Patent
Ki (10) Patent No.: US 7,755,127 B2
(45) Date of Patent: Jul. 13, 2010

(54) CAPACITOR IN SEMICONDUCTOR DEVICE AND METHOD OF MANUFACTURING THE SAME

(75) Inventor: An Do Ki, Choongcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/492,026

(22) Filed: Jun. 25, 2009

(65) Prior Publication Data

US 2009/0262483 A1    Oct. 22, 2009

Related U.S. Application Data

(63) Continuation of application No. 11/611,695, filed on Dec. 15, 2006, now Pat. No. 7,560,333.

(30) Foreign Application Priority Data

Dec. 21, 2005   (KR) ............... 10-2005-0127215

(51) Int. Cl.
*H01L 27/108* (2006.01)
*H01L 29/94* (2006.01)

(52) U.S. Cl. ............ 257/296; 257/301; 257/E27.016

(58) Field of Classification Search ............ 257/296, 257/301, 306, 310
See application file for complete search history.

(56) References Cited

U.S. PATENT DOCUMENTS

| 6,818,498 | B2 * | 11/2004 | Mikawa et al. ........... 438/239 |
| 6,838,352 | B1 | 1/2005 | Zhao |
| 2004/0033661 | A1 * | 2/2004 | Yeo et al. ................ 438/253 |
| 2005/0110115 | A1 * | 5/2005 | Kil et al. ................. 257/532 |
| 2005/0184327 | A1 | 8/2005 | Ozawa |
| 2005/0196915 | A1 * | 9/2005 | Jeong et al. ............. 438/238 |

FOREIGN PATENT DOCUMENTS

| CN | 1540746 | 10/2004 |
| KR | 1020050112766 A | 12/2005 |

* cited by examiner

*Primary Examiner*—Phat X Cao
*Assistant Examiner*—Nga Doan
(74) *Attorney, Agent, or Firm*—Sherr & Vaughn, PLLC

(57) ABSTRACT

A capacitor may include at least one of a polysilicon layer over a semiconductor substrate; a capacitor dielectric layer over a polysilicon layer; an insulating layer over a capacitor dielectric layer; a metal layer connected to a capacitor dielectric layer through a first region of an insulating layer; an upper metal wiring layer connected to a metal layer over an insulating layer; and/or a lower metal wiring line layer connected to a polysilicon layer through a metal contact that passes through a second region of an insulating layer and a capacitor dielectric layer over the insulating layer.

10 Claims, 8 Drawing Sheets

CAPACITOR IN SEMICONDUCTOR DEVICE AND METHOD OF MANUFACTURING THE SAME

The present application is a Continuation Application of a U.S. patent application Ser. No. 11/611,695 filed on Dec. 15, 2006 now U.S. Pat. No. 7,560,333, which claims priority under 35 U.S.C. 119 and 35 U.S.C. 365 to Korean Patent Application No. 10-2005-0127215 (filed on Dec. 21, 2005), which is hereby incorporated by reference in its entirety.

BACKGROUND

Figure 1:
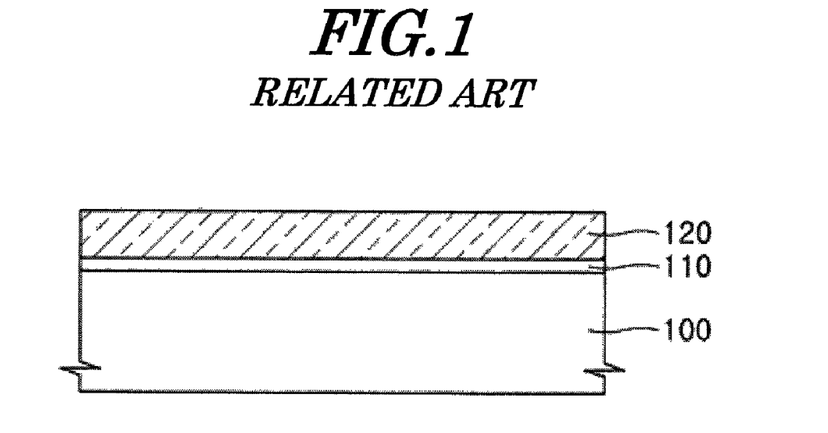
FIGS. 1 to 5 are sectional views illustrating a capacitor of a semiconductor device and a method of manufacturing the same.

FIGS. 1 to 5 are sectional views illustrating a capacitor of a semiconductor device and a method of manufacturing the same. As illustrated in FIG. 1, first polysilicon layer 120 may be formed over semiconductor substrate 100 and insulating layer 110. Insulating layer 110 may be a gate insulating layer. First polysilicon layer 120 may be a gate conductive layer.

Figure 2:
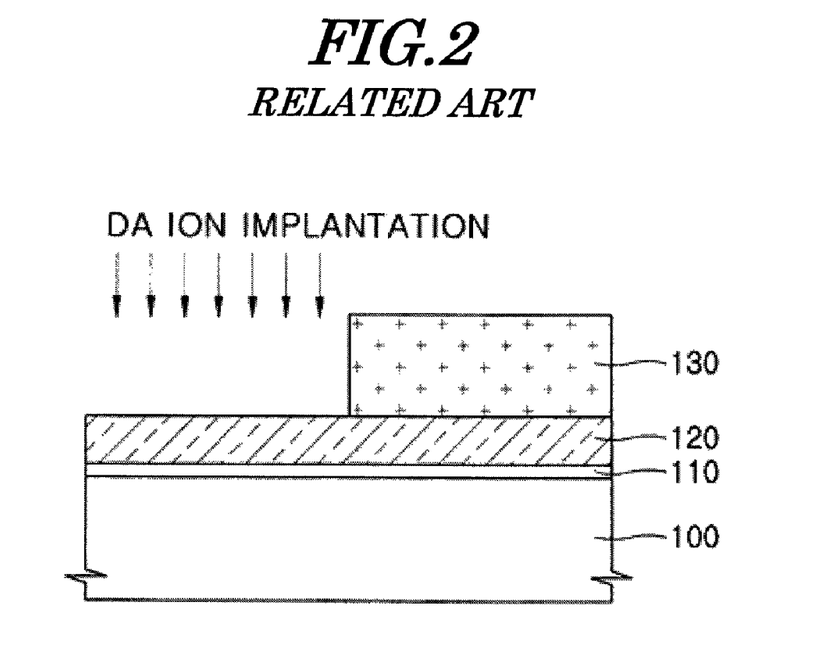

As illustrated in FIG. 2, first photoresist layer pattern 130 may be formed over first polysilicon layer 120. First photoresist layer 130 may partially expose the surface of first polysilicon layer 120. A TEOS oxide layer may be arranged between first polysilicon layer 120 and first photoresist layer pattern 130. A TEOS oxide layer may be a capping insulating layer. DA ion implantation may be performed into an exposed portion of first polysilicon layer 120. After DA ion implantation, first photoresist layer pattern 130 may be removed.

Figure 3:
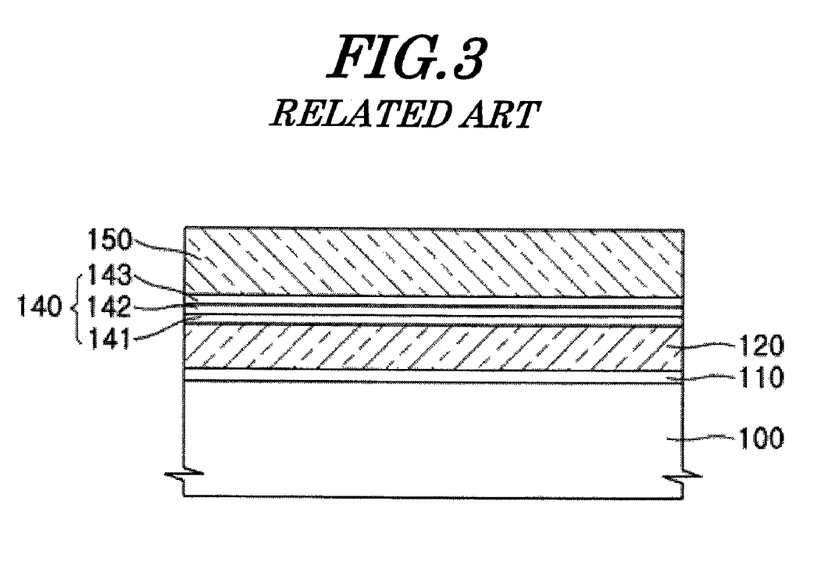

As illustrated in FIG. 3, capacitor dielectric layer 140 may be formed over first polysilicon layer 120. Capacitor dielectric layer 140 may have an Oxide-Nitride-Oxide (ONO) structure. Capacitor dielectric layer 140 may comprise lower oxide layer 141, nitride layer 142, and upper oxide layer 143. Second polysilicon layer 150 may be formed over capacitor dielectric layer 140.

Figure 4:
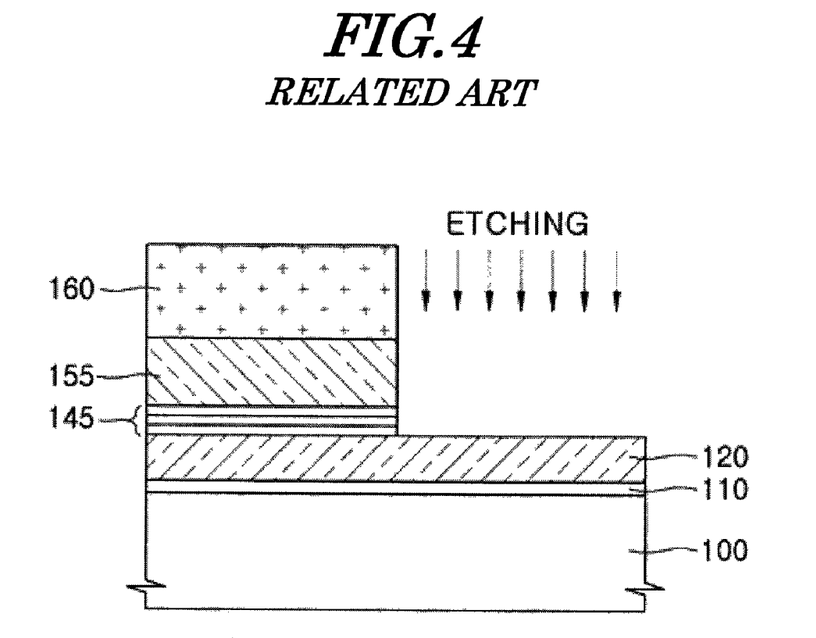

As illustrated in FIG. 4, second photoresist layer pattern 160 may be formed over second polysilicon layer 150. Second polysilicon layer 150 may be etched using second photoresist layer pattern 160 as an etching mask to form second polysilicon layer pattern 155. Capacitor dielectric layer 140 may be etched using second photoresist layer pattern 160 as an etching mask to form capacitor dielectric layer pattern 145. After forming second polysilicon layer pattern 155 and/or capacitor dielectric layer pattern 145, second photoresist layer pattern 160 may be removed.

Figure 5:
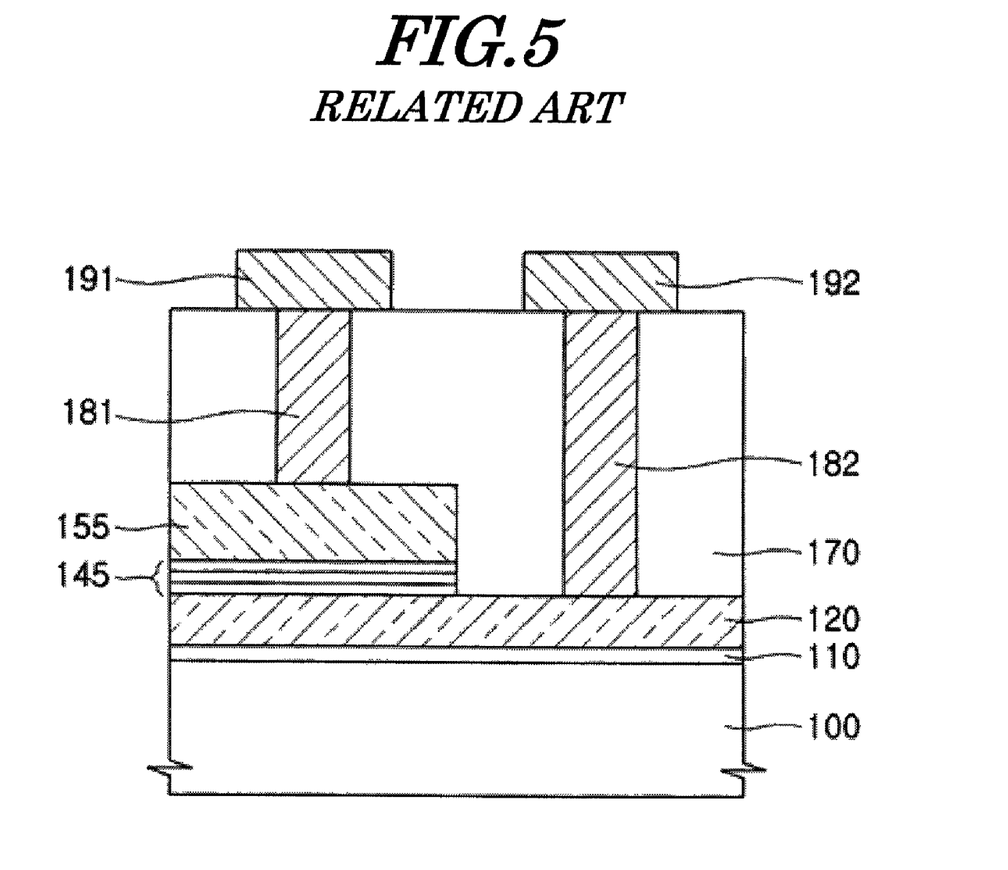

As illustrated in FIG. 5, insulating layer 170 may be formed over semiconductor substrate 100. First metal contact 181 and/or second metal contact 182 may be formed in insulating layer 170. First metal contact 181 may connect to second polysilicon layer pattern 155. Second metal contact 182 may connect to first polysilicon layer 120. Upper metal wiring line layer 191 may be formed over first metal contact 181. Lower metal wiring line layer 192 may be formed over second metal contact 182.

A capacitor having a polysilicon-dielectric layer-polysilicon structure (e.g. PIP structure) may include first polysilicon layer 120 as a lower electrode and second polysilicon layer pattern 155 as an upper electrode. When forming a capacitor, a doped polysilicon layer may need to be deposited and etched, which may make a manufacturing process relatively complicated. Complications may be caused by particles, which may make it difficult to control processes.

SUMMARY

Embodiments relate to a semiconductor device and a method of manufacturing the same. Embodiments relate to a capacitor of a semiconductor device and a method of manufacturing the same. Embodiments relate to a capacitor of a semiconductor device with formation processes that may be simplified by not having to deposit and etch a doped polysilicon layer.

In accordance with embodiments, a capacitor may include at least one of a polysilicon layer over a semiconductor substrate; a capacitor dielectric layer over a polysilicon layer; an insulating layer over a capacitor dielectric layer; a metal layer connected to a capacitor dielectric layer through a first region of an insulating layer; an upper metal wiring layer connected to a metal layer over an insulating layer; and/or a lower metal wiring line layer connected to a polysilicon layer through a metal contact that passes through a second region of an insulating layer and a capacitor dielectric layer over the insulating layer. In embodiments, the width of a metal layer may be larger than the width of a metal contact.

Embodiments relate to a method that includes at least one of: forming a polysilicon layer over a semiconductor substrate; forming a capacitor dielectric layer over a polysilicon layer; forming an insulating layer over a capacitor dielectric layer; removing a first region and a second region of an insulating layer to form a first contact hole and a second hole that expose the surfaces of a first region and a second region of a capacitor dielectric layer; removing an exposed portion of a second region of a capacitor dielectric layer to partially expose the surface of a polysilicon layer; filling a first contact hole that partially exposes the surface of a capacitor dielectric layer and a second contact hole that partially exposes the surface of a polysilicon layer with a metal layer to form a metal layer in the first region and a metal contact in the second region; and/or forming an upper metal wiring line layer and a lower metal wiring line layer connected to a metal layer and a metal contact over an insulating layer.

In embodiments, a method includes implanting n-type impurity ions in a polysilicon layer after forming the polysilicon layer. In embodiments, the width of first contact hole is larger than the width of a second contact hole.

BRIEF DESCRIPTION OF DRAWINGS

Example

DETAILED DESCRIPTION OF THE INVENTION

Figure 11:
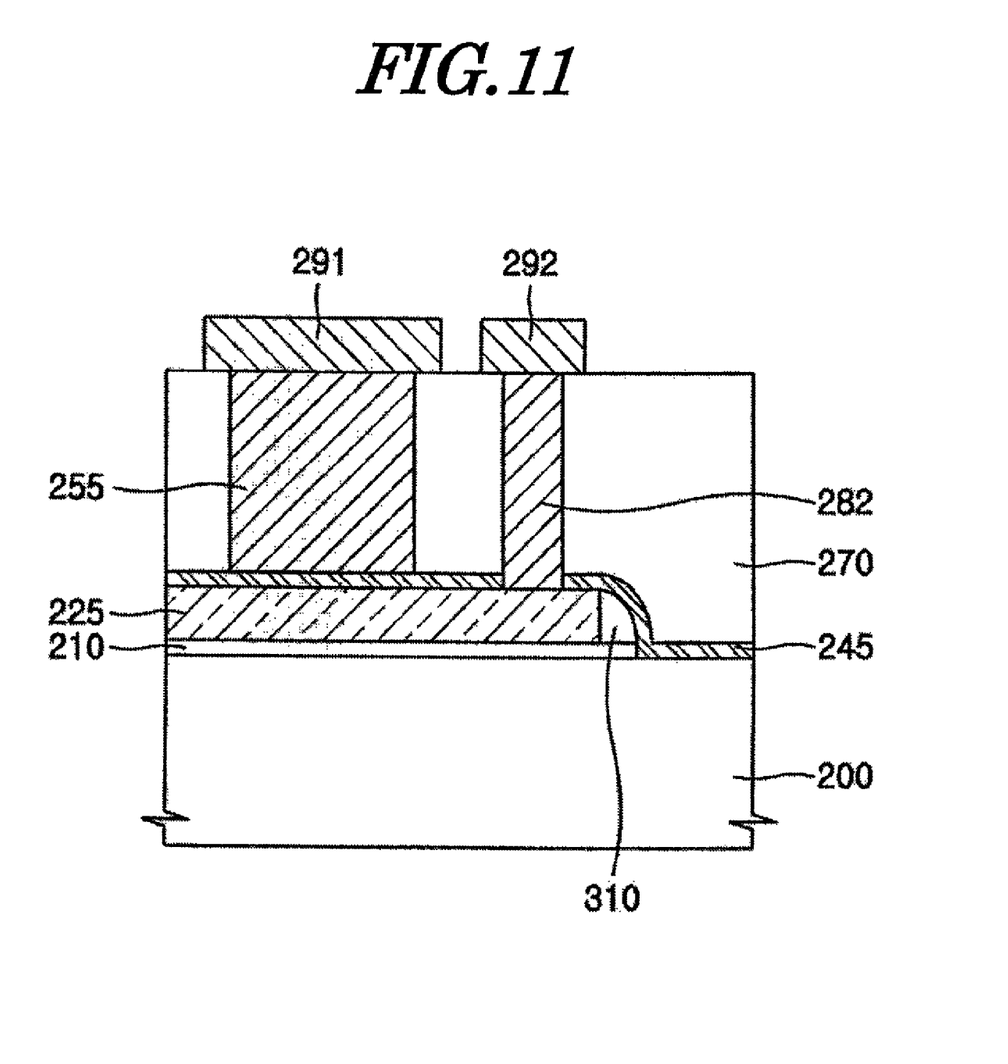

Example FIG. 11 is a sectional view illustrating a capacitor of a semiconductor device, according to embodiments. As illustrated in FIG. 11, gate insulating layer 210 may be formed over semiconductor substrate 200. Polysilicon layer 225 may be formed over gate insulating layer 210. Polysilicon layer 225 may serve as a lower electrode of a capacitor. Capacitor dielectric layer 245 may be formed over polysilicon layer 225. Capacitor dielectric layer 245 may comprise a silicon nitride layer (SiN).

In embodiments, capacitor dielectric layer 245 may have an ON (Oxide/Nitride) structure with an oxide layer and a nitride layer sequentially laminated. In embodiments, capacitor dielectric layer 245 may have an ONO (Oxide/Nitride/Oxide) structure with a lower oxide layer, a nitride layer, and an upper oxide layer sequentially laminated.

Insulating layer 270 may be formed over capacitor dielectric layer 245. Metal layer 255 (e.g. connected to capacitor dielectric layer 245 through insulating layer 270) may be formed in a first region of insulating layer 270. Metal layer 255 may be used as an upper electrode of a capacitor. Metal contact 282 (e.g. connected to polysilicon layer 225 through insulating layer 270 and capacitor dielectric layer 245) may be formed in a second region of insulating layer 270. The width of metal layer 255 may be larger than the width of metal contact 282, which may be tailored to the desired capacitance of a capacitor. Upper metal wiring layer 291 may be formed over metal layer 255. Lower metal wiring layer 292 may be formed over metal contact 282.

In embodiments, a capacitor may have a PIN (Polysilicon/Insulator/Metal) structure with lamination of polysilicon layer 225 as a lower electrode, capacitor dielectric layer 245, and metal layer 255 as an upper electrode. IN embodiments, electrical characteristics may be improved from embodiments where a polysilicon layer is used as an upper electrode.

Figure 6:
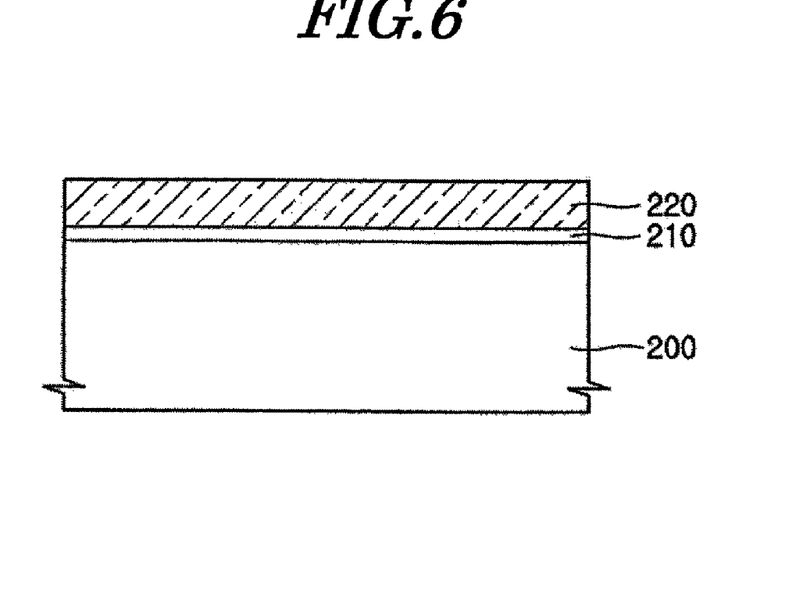
FIGS. 6 to 11 are sectional views illustrating a capacitor of a semiconductor device and a method of manufacturing the same, according to embodiments.

Examples FIGS. 6 to 10 are sectional views illustrating a method of manufacturing a capacitor of a semiconductor device, according to embodiments. As illustrated in FIG. 6, gate insulating layer 210 and polysilicon layer 220 may be sequentially formed over semiconductor substrate 200. Gate insulating layer 210 may comprise an oxide layer. Polysilicon layer 220 may serve as a lower electrode of a capacitor. Polysilicon layer 220 may be formed in the same processing step as the formation of a gate conductive layer in another region of semiconductor 200.

Figure 7:
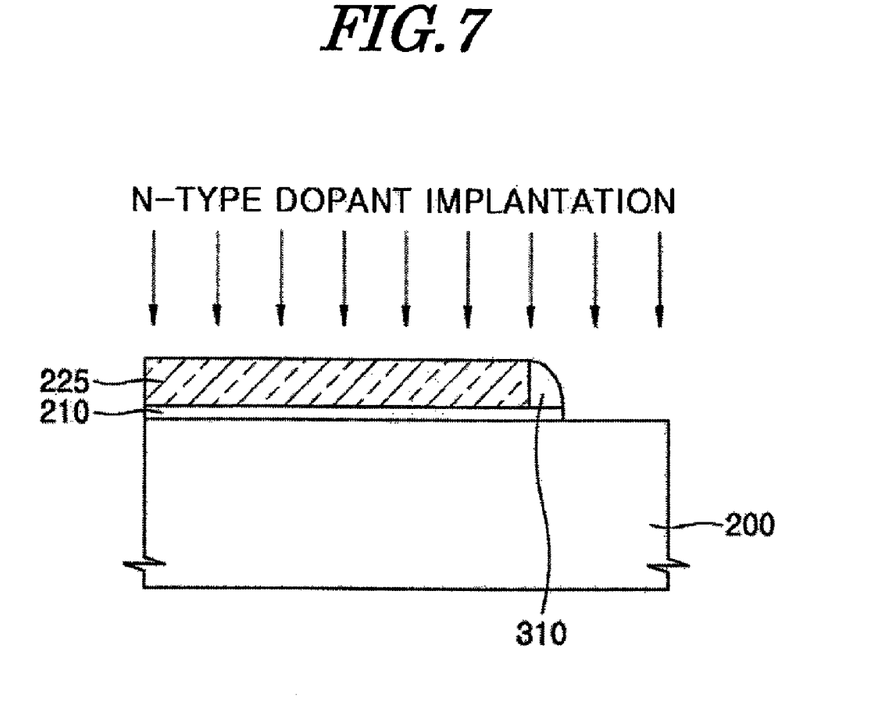

As illustrated in FIG. 7, common patterning may be performed to remove portions of gate insulating layer 210 and polysilicon layer 220, in accordance with embodiments. A side wall spacer layers 310 may be formed on side walls of gate insulating layer 210 and polysilicon layer 220. N-type impurity ions may be implanted to dope polysilicon layer 220, as illustrated in FIG. 7. In embodiments, the resistance of polysilicon layer 220 may be reduced by implantation of n-type impurity ions compared to DA ion implantation in other embodiments.

Figure 8:
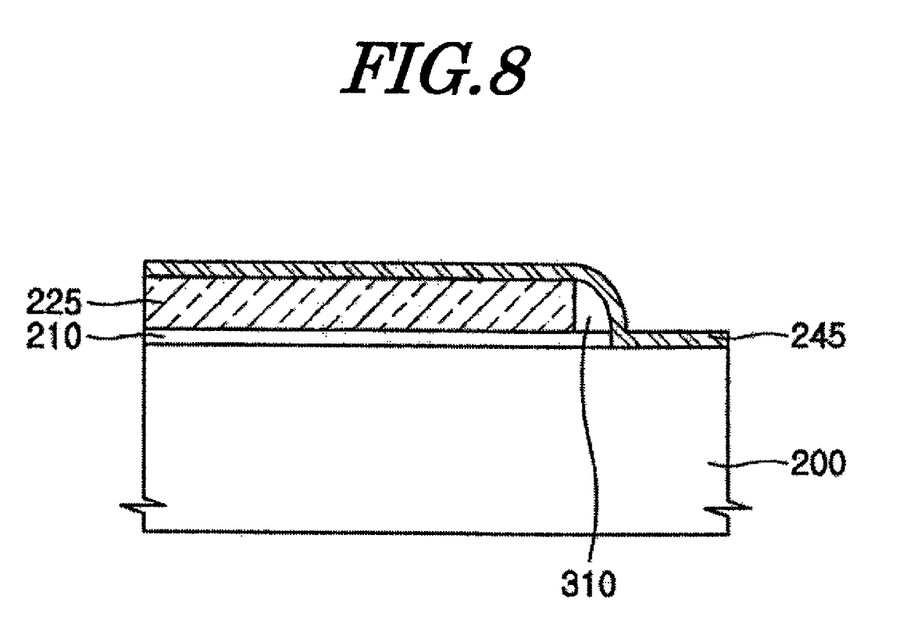

As illustrated in FIG. 8, capacitor dielectric layer 245 may be formed over semiconductor substrate 200. Capacitor dielectric layer 245 may include SiN. In embodiments, capacitor dielectric layer 245 may have an ON (Oxide/Nitride) structure with an oxide layer and a nitride layer sequentially laminated. In embodiments, capacitor dielectric layer 245 may have an ONO (Oxide/Nitride/Oxide) structure with a lower oxide layer, a nitride layer, and an upper oxide layer sequentially laminated.

Figure 9:
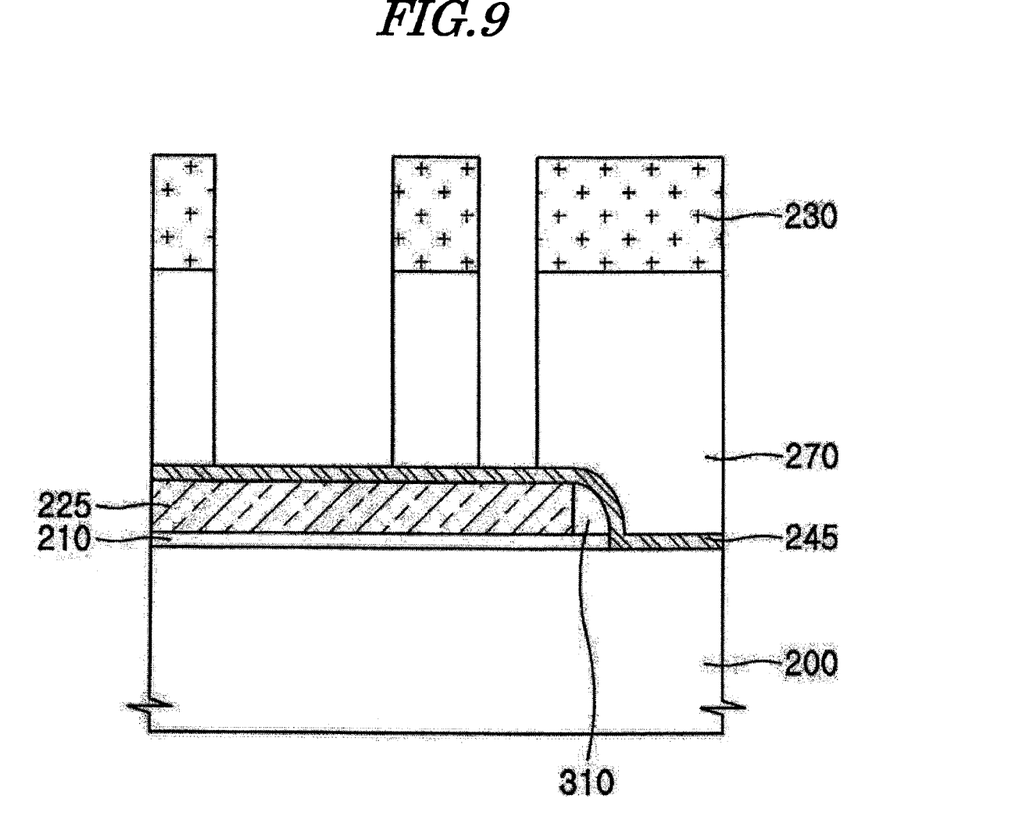

As illustrated in FIG. 9, insulating layer 270 may be formed over capacitor dielectric layer 245. First photoresist layer pattern 230 may be formed over insulating layer 270. Insulating layer 270 may be etched first photoresist layer pattern 230 as an etching mask to remove exposed portions of insulating layer 270. In a first region of insulating layer 270, a first trench may expose a surface of capacitor dielectric layer 245. In a second region of insulating layer 270, a second trench may expose capacitor dielectric layer 245. A first trench may be formed for an upper electrode of a capacitor. A second trench may be formed for a metal contact for connecting a lower electrode of a capacitor and a lower metal wiring line layer. In embodiments, the width of a first trench may be larger than the width of a second trench. In embodiment, the width of the first trench and/or the second trench is determined in accordance with a desired capacitance of a capacitor. After forming a first trench and a second trench, first photoresist layer pattern 230 may be removed.

Figure 10:
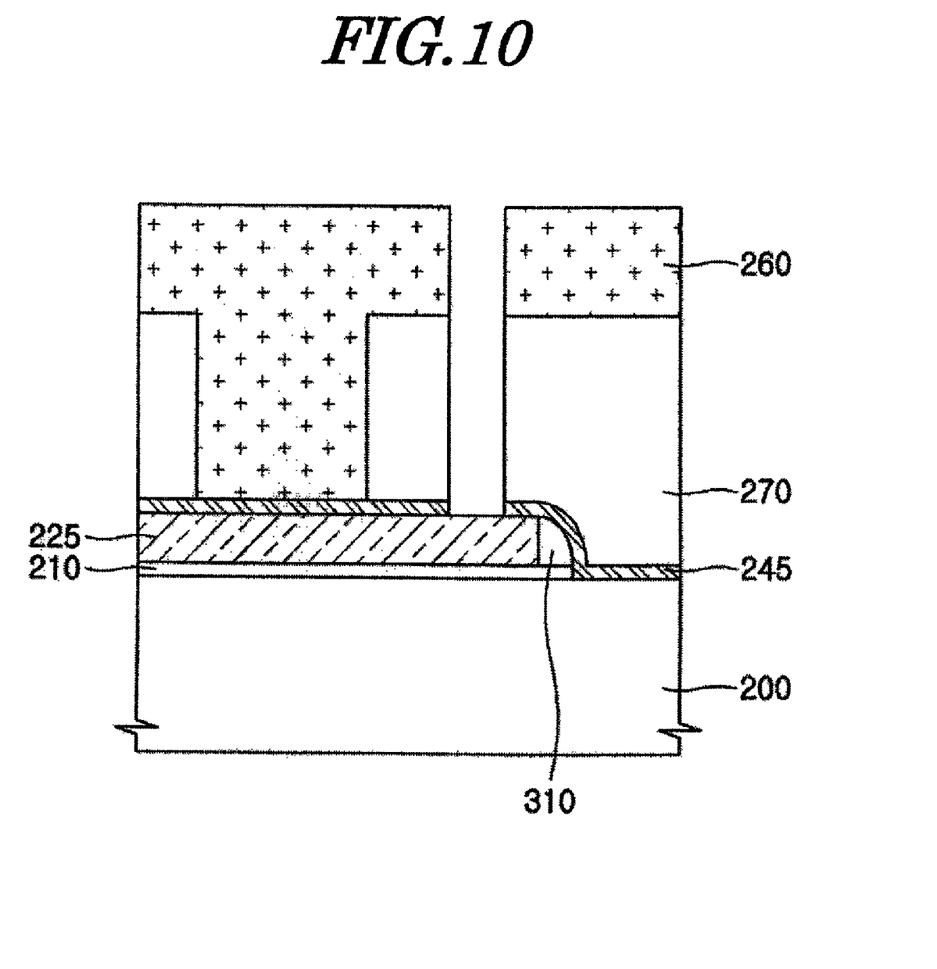

As illustrated in FIG. 10, second photoresist layer pattern 260 may be formed in a first trench and over insulating layer 270, in accordance with embodiments. Second photoresist layer pattern 260 may expose a surface of capacitor dielectric layer 245 at the bottom of a second trench. An etching process may be performed on capacitor dielectric layer 245 at the bottom of a second trench using second photoresist layer pattern 260 as an etching mask to expose a portion of polysilicon layer 225 at the bottom of a second trench. Second photoresist layer pattern 260 may be removed after removing capacitor dielectric layer 245 at the bottom of a second trench.

As illustrated in FIG. 11, metal layer 255 and metal contact 282 may be formed in a first trench and a second trench. Metal layer 255 may electrically contact a surface of capacitor dielectric layer 245, in embodiments. Metal contact 282 may electrically contact a surface of polysilicon layer 225, in embodiments. Metal layer 255 may serve as an upper electrode of a capacitor, in accordance with embodiments. Upper metal wiring line layer 291 and/or lower metal wiring line layer 292 may be formed over metal layer 255 and metal contact 282.

In embodiments, a capacitor may be formed by n-type impurity ion implantation instead of DA ion implantation. In embodiments, a metal layer may serve as ab upper electrode instead of a doped polysilicon layer. In accordance with embodiments, a process of forming a capacitor may be relatively simple. In embodiments, generation of particles may be substantially prevented and/or minimized.

While the invention has been shown and described with reference to certain preferred embodiments thereof, it will be understood by those skilled in the art that various changes in form and details may be made therein without departing from the spirit and scope of the invention as defined by the appended claims.

What is claimed:

1. A capacitor comprising:
   a polysilicon layer formed over a semiconductor substrate;
   a capacitor dielectric layer formed over the polysilicon layer;
   a gate insulating layer formed over the semiconductor substrate and under the polysilicon layer;
   a metal layer formed over the capacitor dielectric layer; and
   a sidewall spacer formed on a side of the polysilicon layer and on a top surface of the gate insulating layer, wherein the sidewall spacer is formed under the capacitor dielectric layer.

2. The capacitor of claim 1, comprising an insulating layer formed over the capacitor dielectric layer, wherein:
   a first contact hole is formed in the insulating layer; and
   the metal layer is formed in the first contact hole.

3. The capacitor of claim 2, wherein:
   a second contact hole is formed through the insulating layer and the capacitor dielectric layer; and
   a metal contact is formed in the second contact hole.

4. The capacitor of claim 3, wherein the first contact hole and the second contact hole are formed in different regions of the insulating layer.

5. The capacitor of claim 3, comprising:
   an upper metal wiring layer formed over the metal layer; and
   a lower metal wiring line layer formed over the metal contact.

6. The capacitor of claim 1, wherein the polysilicon layer is a lower electrode of a capacitor.

7. The capacitor of claim 1, wherein the metal layer is an upper electrode of a capacitor.

8. The capacitor of claim 1, wherein the formation of the polysilicon layer includes N-type ion implantation.

9. The capacitor of claim 1, wherein the width of the metal layer is larger than the width of the metal contact.

10. The capacitor of claim 1, wherein the sidewall is in direct contact with the gate insulating layer, the polysilicon layer, and the capacitor dielectric layer.

* * * * *